United States Patent [19]
Jones

[11] Patent Number: 5,168,206
[45] Date of Patent: Dec. 1, 1992

[54] BATTERY MANAGER CHIP WITH CONNECTIONS FOR REDUNDANT BACKUP BATTERY

[75] Inventor: Brian W. Jones, Garland, Tex.

[73] Assignee: Dallas Semiconductor Corp., Dallas, Tex.

[21] Appl. No.: 631,719

[22] Filed: Dec. 21, 1990

[51] Int. Cl.$^5$ .............................................. H02J 7/04
[52] U.S. Cl. .................................. 320/31; 320/14; 365/229; 307/66
[58] Field of Search .................. 320/5, 13, 14, 31, 32, 320/39, 40; 365/228, 229; 307/64, 66

[56] References Cited

U.S. PATENT DOCUMENTS

| | | | |
|---|---|---|---|
| 3,816,768 | 6/1974 | Stein | 307/64 X |
| 3,980,935 | 9/1976 | Worst | 365/229 |
| 4,006,397 | 2/1977 | Catotti et al. | 320/31 |
| 4,237,385 | 12/1980 | Jurgens et al. | 320/13 X |
| 4,288,865 | 9/1981 | Graham | 365/229 |
| 4,571,531 | 2/1986 | Lin | 320/14 X |
| 4,715,016 | 12/1987 | Lamiaux et al. | 365/229 |
| 4,742,289 | 5/1988 | Wahlstrom | 320/14 |
| 4,843,299 | 6/1989 | Hutchings | 320/31 |
| 4,908,790 | 3/1990 | Little et al. | 307/66 X |
| 4,962,485 | 10/1990 | Kato et al. | 365/229 |
| 5,058,075 | 10/1991 | Mizuta | 307/66 X |

Primary Examiner—Steven L. Stephan
Assistant Examiner—Kristine Peckman
Attorney, Agent, or Firm—Worsham, Forsythe, Sampels & Wooldridge

[57] ABSTRACT

A battery management chip which controls charging and discharging currents of a rechargeable battery. In a portable module, the battery manager chip controls the charging and discharging of the rechargeable battery which powers the whole module, and is therefore connected directly to the battery and to the source of charging current. The chip is also connected to draw very small amounts of current from a third, stable battery, preferably a lithium battery, which is not necessarily rechargeable.

1 Claim, 7 Drawing Sheets

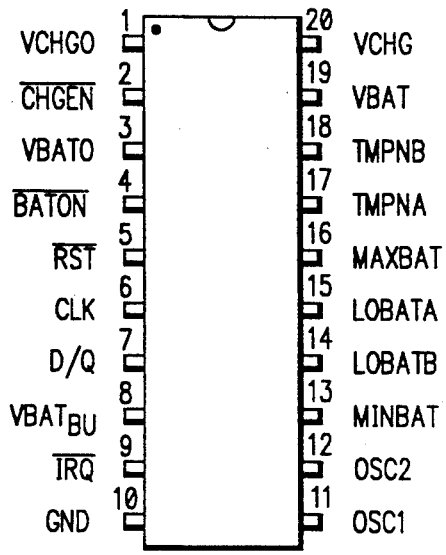

FIG. 4

STATUS-REGISTER 1

| 0 | TF2 TF1 | C4F C3F C2F C1F | IRQF |
|---|---|---|---|
| THIS BIT= LOGIC '0' | TF1=COUNTDOWN TIMER 1 FLAG<br>TF2 COUNTDOWN TIMER 2 FLAG<br>THE FOLLOWING CONDITION WILL SET THESE FLAGS TO A '1' AND A IRQ WILL BE GENERATED IF ENABLED. BITS CLEARED WHEN READ<br><br>TF2  TF1<br>0    0 = CLEARED<br>0    1 = TIMER 1=0<br>1    0 = TIMER 2=0<br>1    1 = BOTH TIMER 1 AND 2=0 | CxF=FLAG BITS WILL BE SET IF ANY OF THE COMPARATORS CHANGE STATE. AN IRQ WILL BE GENERATED IF THE IRQE IS SET IN THE MODE SET REGISTER. THE SET BITS WILL BE CLEARED WHEN REGISTER IS READ. | IRQF=ANY FLAG BIT SET IN THIS REGISTER WILL SET THIS BIT TO A '0'. IT WILL BE CLEARED WHEN READ. |

FIG. 6

PROGRAMABLE CHARGER REGISTERS

| REGISTER | DEFINITION | | | | | | | | |
|---|---|---|---|---|---|---|---|---|---|
| 0 | STATUS 1 | X | TF2 | TF1 | C4F | C3F | C2F | C1F | $\overline{IRQF}$ |
| 1 | STATUS 2 | 0 | 0 | 0 | 0 | 0 | 0 | PSF2 | PSF1 |
| 2 | MODE SET | 1 | 1 | IRQE | $\overline{OSCE}$ | MON | AON | S1 | S0 |
| 3 | MANUAL CONTROL | Vchge | Vbsta | T1E | T2E | C4E | C3E | C2E | C1E |
| 4 | WRITE PROJECT | WP | 0 | 0 | 0 | 0 | 0 | 0 | 0 |
| 5 | TIMER 1 | TIME BYTE 1 ||||||||
| 6 | | TIME BYTE 2 ||||||||
| 7 | | TIME BYTE 3 ||||||||
| 8 | TIMER 2 | TIME BYTE 1 ||||||||
| 9 | | TIME BYTE 2 ||||||||
| A | | TIME BYTE 3 ||||||||
| B | RTC IN BINARY SECONDS | TIME BYTE 1 (LSB) ||||||||
| C | | TIME BYTE 2 ||||||||
| D | | TIME BYTE 3 ||||||||
| E | | TIME BYTE 4 ||||||||
| 10 | | NVSRAM-BYTE 0 ||||||||
| * | USER NV SRAM (16 BYTES) | ||||||||
| * | | ||||||||
| 1F | | NVSRAM-BYTE 15 ||||||||

FIG. 5

STATUS-REGISTER 2

| 0 | 0 | 0 | 0 | 0 | 0 | PSF2 | PSF1 |
|---|---|---|---|---|---|------|------|
| THESE BITS ARE ALWAYS SET TO LOGIC '0' | | | | | | PSF2, PSF1=POWER STATUS FLAGS. THESE FLAGS WILL SET WHEN UNIT IS POWERED UP. AN IRQ WILL BE GENERATED. THESE BITS ARE READ ONLY BITS. ANY CHANGE IN CHARGE VOLTAGE OR BATTERY VOLTAGE THAT MEET THE BELOW CRITERIA WILL GENERATE AN IRQ IF IRQ ENABLE IS SET. THE FIRST POWER UP WILL ALWAYS GENERATE AN IRQ.<br><br>PSF2 PSF1<br>0    1  = VCHG>VBAT<br>1    0  = VCHG<VBAT<br>1    1  = NO POWER | |

FIG. 7

MODE CONTROL-REGISTER 3

| 0 | 0 | IRQE | OSCE | MON | AON | S1 | S0 |
|---|---|------|------|-----|-----|----|----|
| THIS BIT IS ALWAYS A LOGIC '0' | | IRQE=INTERRUPT ENABLE BIT WHEN THIS BIT IS SET TO A 1, ALL INTERRUPTS WILL BE ENABLED. THE 'STATUS' REGISTER WILL SET THE FLAG BIT THAT GENERATES AN INTERRUPT. | SET THIS BIT TO A LOGIC '0' TO START THE CLOCK OSCILLATOR | SET THIS BIT TO A LOGIC '1' TO START MANUAL OPERATION. IF 'AMON' IS SET TO A LOGIC '1' THIS BIT IS CLEARED. | AUTO ON BIT-SET THIS BIT TO A LOGIC '1' TO START THE AUTOMATIC OPERATION. IF MON BIT IS SET, IT WILL BE CLEARED. | S1, S0=VOLTAGE TRIP POINT SET BITS. THESE BITS ARE USED TO SELECT THE DESIRED VOLTAGE TRIP RATIOS FOR COMPARATORS 2 AND 4.<br><br>S1 S0<br>0  0  =DISABLE ALL<br>0  1  =COMP.2=1.25V<br>1  0  =COMP.4=1.25V<br>1  1  =COMP.2&4=1.25V | |

FIG. 8

MANUAL CONTROL-REGISTER 4

| Vchgo | Vbato | T1E | T2E | C4E | C3E | C2E | C1E |
|---|---|---|---|---|---|---|---|
| Vchgo=THIS BIT WHEN SET TO A '1' WILL SWITCH ON THE Vchg INPUT TO THE Vchgo OUTPUT.<br><br>IN THE AUTO MODE, THESE BITS WILL BE SET AND RESET AS DETERMINED BY THE C1-C4 TRIP POINTS AND TIMER 1 AND/OR TIMER 2.<br><br>Vbato=WHEN THIS BIT IS SET TO A '1', Vbat INPUT IS SWITCHED TO THE Vbato OUTPUT.<br><br>NOTE: ON POWER UP, Vchgo OR Vbato WILL BE SET TO A '1'. THIS CONDITION IS DETERMINED BY THE FIRST VOLTAGE INPUT APPLIED. | | SET THESE BITS TO A LOGIC '1' TO ENABLE TIMER 1 AND/OR TIMER 2. | | SET THESE BITS TO A LOGIC '1' TO ENABLE THE COMPARATOR. | | | |

*FIG. 9*

WRITE PROTECT REGISTER 5

| WP | 0 | 0 | 0 | 0 | 0 | 0 | 0 |
|---|---|---|---|---|---|---|---|
| WP-THIS IS THE WRITE PROTECT BIT. SET THIS BIT TO A LOGIC '1' TO INHIBIT WRITING TO ALL OTHER REGISTERS. | THESE BIT ARE ALWAYS SET LOGIC '0'. | | | | | | |

*FIG. 10*

BATTERY MANAGER CHIP WITH CONNECTIONS FOR REDUNDANT BACKUP BATTERY

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATIONS

The following applications of common assignee contain at least some drawings in common with the present application, and are believed to have effective filing dates identical with that of the present application:

Ser. No. 633,372 filed Dec. 21, 1990, now U.S. Pat. No. 5,103,156, entitled "Battery Manager Chip with Differential Temperature Sensing"; and Ser. No. 633,615 filed Dec. 21, 1990, entitled "Battery Manager Chip with On-chip Bandgap Voltage Reference Circuit"; and Ser. No. 633,614 filed Dec. 21, 1990, now abandoned, entitled "Battery Manager Chip with Separate Modes for Standalone and Peripheral Operation"; and Ser. No. 632,378 filed Dec. 21, 1990, recently allowed, entitled "Battery Manager Chip with Crystal-Controlled Time Base";

all of which are hereby incorporated by reference.

BACKGROUND AND SUMMARY OF THE INVENTION

The present invention relates to integrated circuits for controlling the charging and discharging of a rechargeable battery.

Many portable electronic systems are powered by rechargeable batteries, typically Ni-Cd batteries. Such batteries have the advantage that they are portable, non-contaminating, relatively weight-efficient, and can be charged and discharged many times. However, Ni-Cd batteries also have some significant quirks which make optimal control difficult.

First, there is the well-known "memory" effect. If a Ni-Cd battery is repeatedly only partially discharged before recharging, the microstructure of the battery will gradually adapt, so that the battery's full capacity is no longer available.

Another non-linear effect is that total amount of energy which can be withdrawn in a discharge cycle is somewhat dependent on the rate of discharge.

A further non-linear effect is that, if the battery is completely discharged, e.g. into a dead short circuit, the microstructure of the battery will change to reduce the total capacity.

A further non-linear effect is the use of "trickle charge" currents. A battery which is already fully charged can be maintained at maximum readiness by applying a very small current to the battery.[1] This phenomenon is very well known in lead acid batteries and also applies to Ni-Cd batteries.

[1] This current would typically be of the order of "0.1 C," i.e. an amount of current equal to the rated battery capacity divided by 10 hours.

Another perverse characteristic of Ni-Cd batteries is that the voltage of a Ni-Cd will drop at full charge. Thus, in alternative embodiments, the chip of the present invention can be configured to watch for this voltage fall-off as a charging cycle comes to an end.

These difficulties with managing rechargeable batteries have long been generally known. For large rechargeable battery installations, expensive controllers (typically costing $5,000 or more, in 1989 dollars) have been proposed by others. Such controllers attempt to monitor the discharge characteristics of a bank of batteries and control the charging current and/or charging time to maximize the available battery capacity.

In addition, the battery characteristics will also be affected greatly by temperature. For example, a rate of discharge which is not excessive at one temperature may be excessive at another temperature. All of these effects are somewhat difficult to model theoretically, but can be fitted to an empirical model with reasonable accuracy.

These battery management issues apply not only to high performance batteries, such as Ni-Cd or other high-performance battery types, but also to lead acid batteries. Lead acid batteries have a much lower cost-per-unit battery capacity (amp-hours at rated voltage) than do Ni-Cd batteries, but lead acid batteries provide a much lower amount of battery capacity per unit weight and also a much lower amount of battery capacity per unit volume. However, many lead acid battery installations are used in contexts where weight and volume are essentially unlimited. In such cases, the designer of a lead acid battery installation can provide some additional margin for error by increasing the size of the battery banks used.

The present invention provides very sophisticated battery monitoring functions in a single integrated circuit. Thus, reliable portable electronic modules, powered by rechargeable batteries, can be configured with greatly improved battery management capabilities.

This is particularly valuable in electronic devices where sudden battery failure could cause an intolerable loss of data. One key example of this type is lap-top computers. Another important class of applications is hand-held scientific or medical instruments. Another important class of applications is in hand-held portable data collection terminals. Another important class of applications is in military and police equipment, such as portable radio transceivers. A very important class of applications is in hand-held portable tools for commercial and industrial use.

The present invention provides a battery management chip which, in the presently preferred embodiment, incorporates several novel features. Not all of the features described are necessary to the claimed invention, but the combination of all of the features described is particularly advantageous.

The presently preferred embodiment of the battery manager chip includes an on-chip PMOS pull-up transistor, which can turn charging current to the battery on or off. (A corresponding logic output is also provided to control discrete switching transistors if desired for a larger current capability.)

One of the innovative features of the present invention is the provision of an integrated circuit with a comparator having two inputs for differential temperature-sensing base on inputs from two different sensors. Thus, one thermocouple or thermistor can be placed in close thermal contact with the casing of the battery, while the other thermistor is exposed to ambient temperature. This permits a temperature rise in the battery to be sensed. This is very useful in controlling charging characteristics. Otherwise, the rate of charging current may be excessive under a low ambient temperature and lower than necessary under high ambient temperature.

Another of the innovative features of at least one embodiment disclosed herein is that, in a portable module, the battery manager integrated circuit controls the charging and discharging of the rechargeable battery which powers the whole module, and is also connected to draw power from an external power supply, and is also connected to draw very small amounts of current from a third, stable battery, preferably a lithium battery, which is not necessarily rechargeable.

The integrated circuit of the presently preferred embodiment has also been designed to provide versatility for other analog interface or control functions in addition to battery management. For example, the two analog sensor interface circuits can be used not only for differential temperature assessing of battery temperature rise, but can also be used for inlet and outlet coolant temperature sensing and air-cooled or even liquid-cooled systems. Note that these inputs can also be used for pressure sensors, fluid level detectors, fluid flow detectors, or other sensor input interfaces.

In the presently preferred embodiment, these inputs are connected to thermistor temperature sensors. A thermistor is a temperature-dependent variable resistor, which therefore requires a biased current input to provide a voltage output. The biased current would normally be provided by an off-chip source. Alternatively, for some applications it may be preferable to provide temperature sensing from a thermal couple plus an instrumentation amplifier.

One of the key novel teachings is a battery manager integrated circuit which is configured for interface to a microprocessor. This provides system configurations to be implemented, wherein a system microprocessor can intelligently monitor battery-charged state, among other characteristics.

In particular, one characteristic of the integrated circuit of the presently preferred embodiment which gives additional versatility is its capability for automatic and manual modes. That is, the integrated circuit of the presently preferred embodiment can be configured so that it acts independently to disconnect current sourced from the battery when the battery becomes excessively low; or it can be configured to act simply as a microprocessor peripheral, so that the battery manager chip provides warnings but does not implement connection or disconnection actions.

Another significant teaching of the presently preferred embodiment is a battery manager integrated circuit which includes an on-chip bandgap voltage reference. The circuitry for bandgap voltage references is conventional, and a variety of circuit configurations are very well-known, but bandgap voltage references normally have a significant power consumption. However, the precise voltage reference derived from such a circuit is extremely useful in performing the battery control function as described below. (In alternative embodiments, the on-chip bandgap voltage reference can be replaced with expedients such as an off-chip zener diode voltage reference.)

A further novel teaching set forth in the present application is an integrated circuit which includes a crystal-controlled oscillator for precise time measurement. Crystal-controlled oscillators are normally fairly power-hungry circuits, and such circuits would not normally be used in the low-power part unless needed. However, according to this innovative teaching, the precise time integration provided by the crystal oscillator is significantly advantageous, since it permits accurate time integration to derive the present state of the battery after multiple charge and discharge cycles. In addition, in the presently preferred embodiment, a low-power crystal-controlled oscillator is used.

In the presently preferred embodiment, the battery manager integrated circuit is configured as an n-well part. The advantage of this is that the substrate is held at ground. This is advantageous in handling the multiple power input described below. The open-drain outputs used can be pulled high without abnormal problems. In particular, if the charging current supply voltage goes above the on-chip VDD voltage, as may well occur, this chip configuration will avoid any problem of junctions thereby being forward biased. Thus, the oscillator configuration of the presently preferred embodiment is the dual circuit to that shown in the DSC-74 application cited more specifically in the preferred embodiments.

A further novel teaching disclosed herein is the integrated circuit battery manager which can predict an imminent low-battery condition without waiting until voltage measurements show that the battery is actually dying. The precise measurement capabilities of the presently preferred embodiment permit this to be achieved. In addition, the presently preferred embodiment of the battery manager chip includes two low-battery outputs. These are referred to in the text below, as the "low-battery" and "MIN-battery" status bits. These may be thought of as warning conditions and alarm conditions respectively.

A further innovative feature of the battery manager chip of the presently preferred embodiment is the capability for both on-chip and off-chip switching of both charge and discharge currents. Whenever sizable currents need to be handled, it will of course be preferable to use a discrete transistor, such as a discrete power PMOS device controlled by logic signals generated from the battery manager chip. However, in addition, in low-current applications (e.g., where the current switched is of the order of hundreds of milliamps or less), the currents needed may be within the capability of on-chip to these PMOS drivers. Another consideration is whether the voltage drop incurred by going on-chip drivers, and then off-chip again, is acceptable. The present invention provides capability for both configurations, and therefore provides additional flexibility to the end user.

Another notable feature of the presently preferred embodiment is the multiplicity of comparators provided. In the presently preferred embodiment, four comparators are provided, two single-ended and two differential. The single-ended comparators, in the presently preferred embodiment, are used for the tests which generate the max-battery and min-battery signals. The differential comparators are used for temperature sensing, according to the innovative teachings set forth above, and for detection of a low-battery condition. Note that a differential comparator is not strictly necessary for detection in the low-battery condition. However, the provision of the additional differential comparator provides additional versatility for this chip to be used in applications beyond those limited to battery management, as described above.

A further notable feature of the presently preferred embodiment is that the comparators all have a one-way trip operation. That is, electrically, these comparators are combined with other circuit elements to achieve significant hysteresis. For example, when the operating conditions are just on the margin of tripping the low-voltage detection, it would be undesirable to have the corresponding signal turning on and off intermittently. Thus, in the presently preferred embodiment, circuit hysteresis in included (e.g. by including a latch in the circuit), so that the user normally has to service the interrupt to clear the trouble signal.

In an alternative embodiment, instead of using two differential comparators as shown, one of the pins is used instead for a programmable interrupt. The programmable interrupt, in addition to the primary interrupt, can be used to program the chip for sensing a particular condition. Thus, for example, the output on a programmable interrupt can be used to drive an LED or an audible alarm, to flag some particular anticipated condition for user response.

BRIEF DESCRIPTION OF THE DRAWING

The present invention will be described with reference to the accompanying drawings, which show important sample embodiments of the invention and which are incorporated in the specification hereof by reference, wherein:

FIG. 4 shows the pinout of the integrated circuit of the presently preferred embodiment.

FIG. 5 shows the register structure of the integrated circuit of the presently preferred embodiment.

FIG. 6 shows the preferred bit organization of Status Register 1, in the integrated circuit of the presently preferred embodiment.

FIG. 7 shows the preferred bit organization of Status Register 2, in the integrated circuit of the presently preferred embodiment.

FIG. 8 shows the preferred bit organization of the Mode Register (Register 3), in the integrated circuit of the presently preferred embodiment.

FIG. 9 shows the preferred bit organization of the Manual Control Register (Register 4), in the integrated circuit of the presently preferred embodiment.

FIG. 10 shows the preferred bit organization of the Write Protect Register (Register 5), in the integrated circuit of the presently preferred embodiment.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Preferred Chip Embodiment

Figure 1:
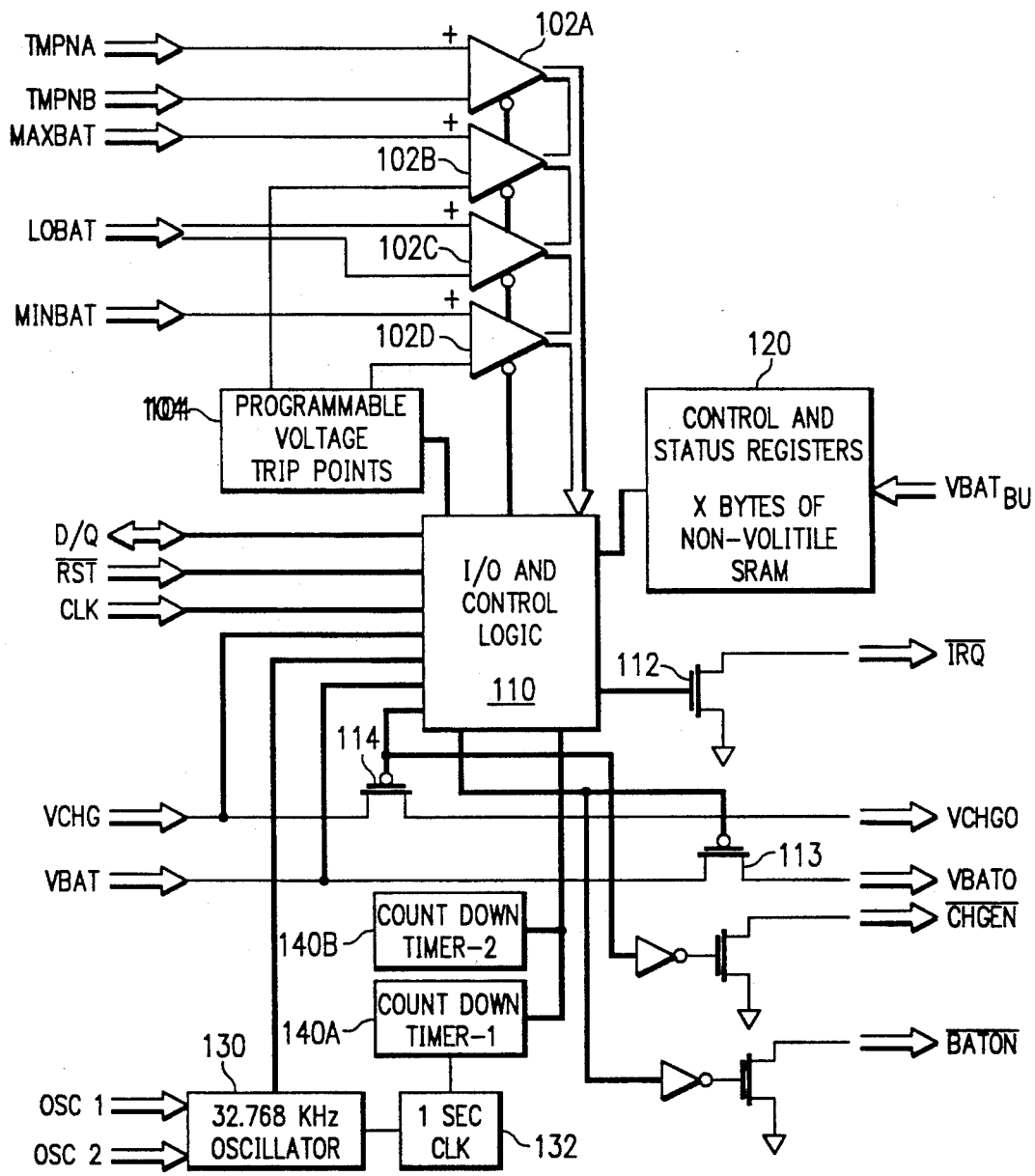
FIG. 1 shows the overall organization of the integrated circuit of the presently preferred embodiment.
Figure 2:
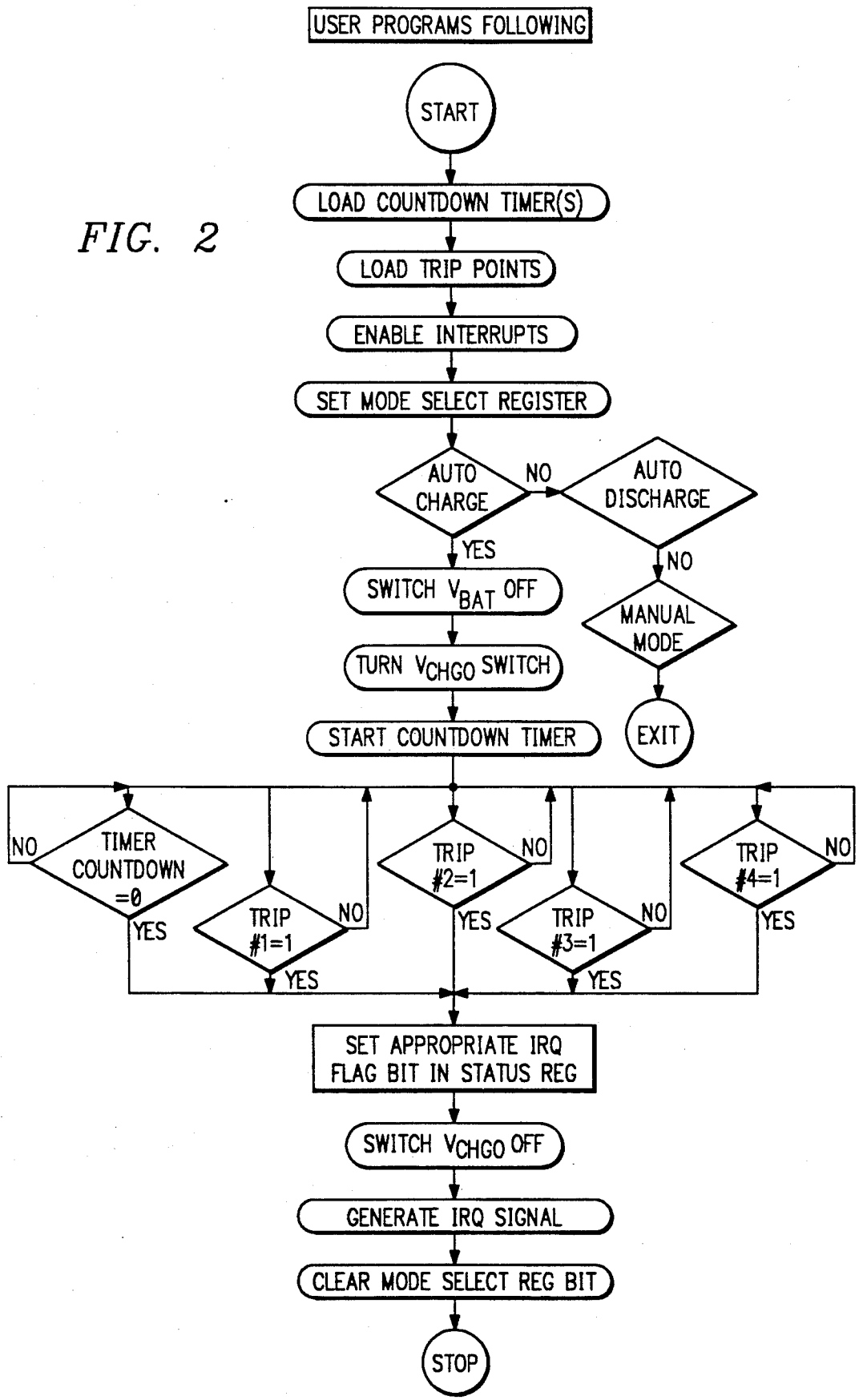
FIG. 2 shows the control flow implemented by the control logic in the presently preferred embodiment of the chip of FIG. 1.

FIG. 1 shows the overall organization of the preferred chip embodiment. In this embodiment, four comparators 102A-102D are provided. Note that, in the presently preferred embodiment, comparators 102A and 102C are both connected to receive double-ended (fully differential) external inputs. Comparators 102B and 102D are each connected to compare an external input to a programmable reference voltage, received from a programmable voltage source 104. The voltage source 104 includes a conventional bandgap-voltage-reference circuit, plus two switchable resistor ladders. The resistor ladders are switched, under the control of the I/O and control logic 110, to implement hysteresis in the detection characteristics.

Battery-backed memory 120 provides control and status registers. (The organization of these registers will be described in detail below.) Battery-backed memory 120 also, in the presently preferred embodiment, provides nonvolatile RAM space for user-defined data. (For example, this memory space can be used to track power history.)

An open drain NMOS pull-down driver 112 permits the control logic 110 to drive an interrupt signal IRQ\"

Logic outputs from the control logic 110 also control two large PMOS pass transistors 113 and 114. The size of these pass transistors is selected in accordance with the space available on-chip (included the area needed for low-resistance, i.e. wide, metal lines), and in accordance with the application requirements for maximum voltage drop at rated current through this path. Device 113 preferably has a net total[2] W/L ratio (ratio of effective width to effective length) of at least 100:1, and preferably larger. Device 114 preferably has a W/L ratio of at least 100:1, more preferably at least 300:1, and preferably much larger.

[2] Such large devices are commonly configured as multiple active areas in parallel.

Note that a corresponding logic signal BATON\" is pulled active whenever pass transistor 113 is turned on.

Note also that a corresponding logic signal CHGEN\" is pulled active whenever pass transistor 113 is turned on.

An analog oscillator circuit 130 is connected, through external pins OSC1 and OSC2, to a resonant quartz crystal (not shown) which stabilized the oscillator frequency at 32.768 kHz, in the presently preferred embodiment. The oscillator's frequency is divided down, by following stages 132, to provide a digital signal with a frequency of 1 Hz (one pulse per second). In the best mode as presently contemplated, this oscillator is essentially the same as the oscillator described in U.S. Pat. No. 4,871,982, which is hereby incorporated by reference, except that the polarity is reversed (since the presently preferred embodiment is an N-well part).

When the control logic 110 receives a pulse from the timing circuit 132, it updates the timing registers in memory 120, and then tests for time-out alarms.

Note that two timers 140A and 140B are provided. It is contemplated that, in operation, one of these timers will hold a maximum time for charging operations, and the other will hold a maximum duration for discharging.[3] However, it should also be noted that the provision of two stored time-out values minimizes the number of data transfer steps needed at each update cycle. It should also be noted that the provision of two stored time-out values provides the user with additional flexibility to adapt this chip to applications other than battery management.

[3]Thus, during charging, the chip of the preferred embodiment watches for a timeout or a temperature condition or a voltage condition. During discharging, the chip of the preferred embodiment watches for a timeout or a voltage condition.

The contemplated best mode for implementing the control logic 110 is with an on-chip sequencer, similar to those used in the DS1286 or DS1287 chips. (These two chips contain generally similar sequencer hardware, although the program implemented is significantly different.) These chip, and there data sheet, are available from Dallas Semiconductor, and are each hereby incorporated by reference. See also U.S. patent applications Ser. No. 208,889 filed Jan. 17, 1988, now U.S. Pat. No. 5,060,113, and Ser. No. 569,314, filed Aug. 16, 1990, now abandoned, both of which are hereby incorporated by reference. However, of course, it would alternatively be possible to simply implement the described functions in hard-wired logic.

The control logic 110 also contains conventional interface circuitry for interfacing to the 3-wire serial port (pins RST\", D/Q, and CLK).

FIG. 4 shows the pinout of the preferred chip embodiment.

PIN 1 VCHGO—(output) switched charging supply
PIN 2 CHGEN\"—(output) charge enable signal, open drain
PIN 3 VBATO—(output) switched battery supply
PIN 4 BATON\"—(output) battery on signal, open drain active low
PIN 5 RST\"—(input) reset for serial port, active low
PIN 6 CLK—(input) clock for serial port
PIN 7 D/Q—(input/output) data I/O for serial port, open drain
PIN 8 $VBAT_{BU}$—(input) this is the power input for a nonrechargeable battery (preferably a small lithium battery) for data retention.
PIN 9 IRQ\"—(output) interrupt request, open drain active low
PIN 10 GND—(input) ground
PIN 11 OSC1—(input) 32,768 kHz crystal input 1
PIN 12 OSC2—(input) crystal input 2
PIN 13 MINBAT—(input) comparator input signal to set minimum battery voltage trip point
PIN 14 LOBATA—(input) differential comparator input signal to detect low battery voltage
PIN 15 LOBATB—(input) differential comparator input signal to detect low battery voltage
PIN 16 MAXBAT—(input) comparator input to set maximum battery voltage trip point
PIN 17 TMPNA—(input) ambient temperature input signal
PIN 18 TMPNG—(input) battery temperature input signal
PIN 19 VBAT—(input) battery supply input
PIN 20 VCHG—(input) charge supply input 2-7 volts FIG. 5 shows the register structure in the memory 120, and FIGS. 6–10 provide further detail of the two status registers (FIGS. 6–7), the mode set register (FIG. 8), the manual control register (FIG. 9), and the write protect register (FIG. 10).

Sample System Configuration

Figure 3:
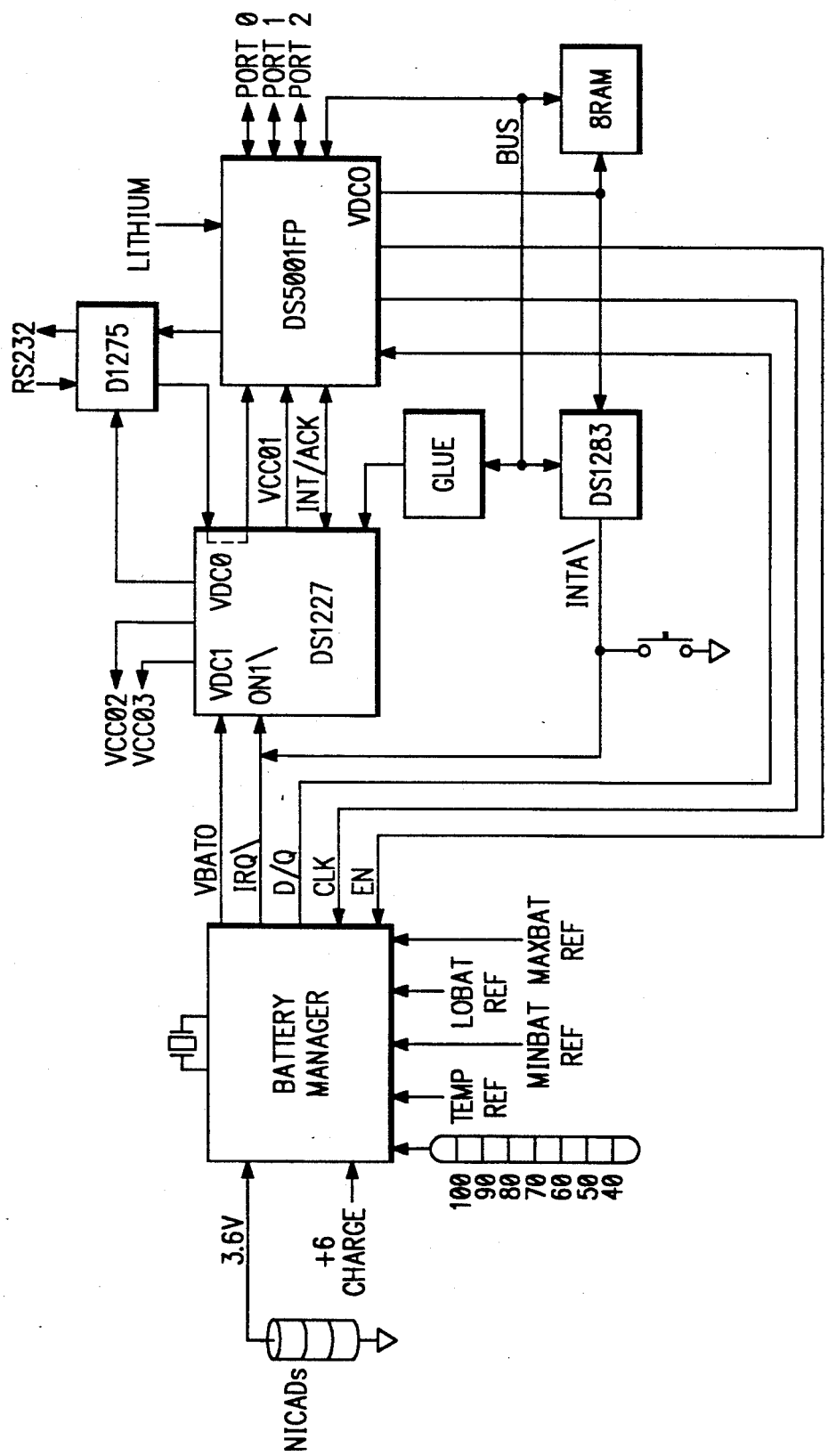
FIG. 3 shows a sample system configuration.

FIG. 3 shows a sample system configuration provided by the innovative teachings disclosed in the present application. This particular configuration is a relatively complex system, such as might be used for a handheld scientific instrument with data collection capabilities. However, of course, simpler system configurations can be used instead.

Further Modifications and Variations

It will be recognized by those skilled in the art that the innovative concepts disclosed in the present application can be applied in a wide variety of contexts. Moreover, the preferred implementation can be modified in a trmendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

In another alternative embodiment, the charging and/or discharging currents can be pulsed. For rapid charging, it is normally advantageous to give the battery occasional resting periods during the charging process.

It should also be noted that a variety of control relationships can be implemented using the chip of the presently preferred embodiment. Some of these will now be discussed: Methods of charging:

1) Time Only—specific periods of charging at a specified rate. This method would have no feedback from the battery and the user would have to be careful not to overcharge and damage the battery or allow the battery to be discharged into cell reversal. If the charger/monitor only has a control line to gate an external device then the rate information would not be needed for this method. The part could revert to "trickle charging" after the specified period of charging has elapsed or it could stop charging altogether.

2) Voltage only—charging the battery at a specified rate until a specified voltage condition is met. This method could be carried out three different ways:
a) absolute cutoff—when the specified voltage is met, stop charging or go to "trickle charge". This method would probably only require a comparator with programmable trip points.
b) inflection point cutoff—this occurs when the derivative of the voltage-profile slope equals 0. Practically, the decreasing value of the positive voltage slope that occurs just beyond the inflection point is used as the control parameter. This method has the advantage of allowing for the limiting of the charging current as the battery approaches a full state of charge since the inflection point occurs prior to the voltage peak. However, under some conditions (e.G., Attempting to fast charge a fully charged battery), the battery does not display a voltage profile suitable for this method. Once again, the charging could be stopped or switched to "trickle charge" upon detection of this condition. This method would require an a/d converter plus an interface with the micro which allows for the passing of data for the calculation of the inflection point. C) negative delta v—this condition is based on the peak and subsequent decrease in the battery voltage at full charge. The value of negative delta v that is generally used is from 10 mv/cell to 30 mv/cell. After detecting this condition, the charging could be stopped or switched to "trickle charging". This method would require an a/d converter plus an interface with the micro which allows for the passing of data for the calculation of the slope of the voltage profile.

3) Temperature only—charging the battery at a specified rate until a specified temperature condition is met. This method can be carried out in one of two ways:

a) absolute temperature cutoff (tco)—when the absolute temperature specified is reached, stop the battery charging or switch to "trickle charging". The most commonly used settings for the absolute temperature are 40 and 45 degrees celsius. Problems associated with this method include: 1) charging the battery in a low temperature environment since it may never reach the cutoff point, 2) charging cold batteries since their temperature rise may lag the state of charge, and 3) charging hot batteries since the trip point may be reached prematurely. This method does have the advantage of only requiring one temperature sensor which is in contact with the battery.

b) incremental temperature cutoff (delta tco)—when the temperature difference between the battery and the ambient surroundings is sensed, stop the charging or switch to "trickle charging". The most commonly used settings for the temperature difference are 5 and 10 derees celsius. The delta *tco method overcomes the problems experienced with absolute tco in cold environments and/or with cold batteries because it reacts only to change but it does not solve the problem created when a hot battery is placed in the charger. (Note: for both temperature methods above, the requirements for the interface from the temperature sensor to the chip are not known at this time.)

4) Time and voltage charging—this is probably the simplest combination to implement and still have reasonable control and feedback from the battery. However, if inflection point cutoff or negative delta v voltage detection is used, the task becomes somewhat more complicated.

5) Time and temperature charging—this combination would be appropriate for conditions where the temperature of the batteries will not exceed the trip point of the circuit except when they are at full charge.

6) Voltage and temperature charging—these two methods in combination would probably do the job in most cases, however since the part will have a timer it seems fruitless to only use voltage and temperature.

7) Time, voltage, and temperature charging—this is obviously the best combination to use because it gives the most information about the battery. However, this translates to the most complicated charger.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A battery management integrated circuit, comprising:
    a first node for ground, a second node for a source of charging current, a third node for an electrical load, and a fourth node for the hot terminal of a rechargeable battery;
    a first switching transistor configured to selectably connect said second node to said fourth node;
    a second switching transistor configured to selectively connect said fourth node with said third node;
    a plurality of comparators, including at least one comparator connected to detect when the voltage at said fourth node becomes smaller than a first predetermined voltage;
    control logic connected to respond to the respective outputs of said comparators and configured to accordingly turn on said first switching transistor when said voltage at said fourth node becomes smaller than said first predetermined voltage and to turn on said second switching transistor when said said voltage at said fourth node becomes larger than a second predetermined voltage;
    memory space including control registers accessible to said control logic, said control logic being configured to operate with dependence on the contents of said control registers;
    a fifth node for a non-rechargeable battery;
    said memory being connected to be powered from said fifth node so that the contents of said control registers is preserved even if said fourth node and said second node are both at ground potential.

* * * * *